United States Patent [19]

Ansaldi et al.

[11] 4,303,837

[45] Dec. 1, 1981

[54] WAVEFORM SYNTHESIZER WITH DIGITALLY CONTROLLED PHASE ADJUSTMENT OF OUTPUT

[75] Inventors: Renato Ansaldi; Sergio Vallero, both of Turin, Italy

[73] Assignee: Cselt-Centro Studi e Laboratori Telecomunicazioni S.p.A., Turin, Italy

[21] Appl. No.: 73,302

[22] Filed: Sep. 7, 1979

Related U.S. Application Data

[63] Continuation-in-part of Ser. No. 883,581, Mar. 6, 1978, abandoned.

[30] Foreign Application Priority Data

Mar. 9, 1977 [IT] Italy .............................. 67508 A/77

[51] Int. Cl.[3] ...................... H03K 3/023; H03K 4/08; H03K 3/78; H03L 7/16

[52] U.S. Cl. .................................... 307/262; 307/228; 307/529; 328/14; 328/61; 328/155

[58] Field of Search ................. 328/14, 129, 130, 187, 328/61, 155; 307/260, 262, 228, 529

[56] References Cited

U.S. PATENT DOCUMENTS

| | | | |
|---|---|---|---|
| 3,657,658 | 4/1972 | Kubo | 328/61 |
| 4,109,164 | 8/1978 | Caron | 328/61 X |
| 4,142,184 | 2/1979 | Lake | 328/14 |

*Primary Examiner*—John S. Heyman

*Attorney, Agent, or Firm*—Karl F. Ross

[57] ABSTRACT

A circuit arrangement for producing a composite waveform comprises a multiplexer controlled by a logic network for successively energizing a load with an aperiodic voltage from a switching circuit and one or more sine waves or other periodic voltages continuously produced by respective oscillation generators. The logic network includes a cycle counter stepped by a selected oscillation generator for terminating the transmission of its output voltage ater a preset number of cycles. An analog comparator, continuously receiving a d-c potential from a manually settable voltage source and a sawtooth voltage from each oscillation generator, emits an enabling pulse to the logic network upon detecting a coincidence between the sawtooth voltage of a selected generator and either the manually selected d-c potential or the sawtooth voltage from another selected oscillation generator.

10 Claims, 10 Drawing Figures

WAVEFORM SYNTHESIZER WITH DIGITALLY CONTROLLED PHASE ADJUSTMENT OF OUTPUT

CROSS-REFERENCE TO A RELATED APPLICATION

The present application is a continuation-in-part of commonly owned U.S. patent application Ser. No. 883,581, filed Mar. 6, 1978 and now abandoned.

FIELD OF THE INVENTION

Our present invention relates to a synthesizer of composite waveforms.

BACKGROUND OF THE INVENTION

Electronic appliances and servomechanisms frequently require the generation of a waveform comprising a train of oscillations each having a particular shape and frequency and extending in time for a predetermined number of cycles, the composite waveform being well defined as to initial and final phase. For example, servomechanisms for controlling the rotation and eventual positioning of a device such as an aerial or a pointer or reference index usually comprise synchronous motors which drive the load through a step-down transmission and are powered by a rotating magnetic field generated by a pair of waveforms in phase quadrature; it is necessary for the correct operation of such servomechanisms that the quadrature waveforms begin with a definite phase, continue for a certain number of periods and end with another definite phase.

A problem arising in the utilization of composite waveforms of high frequency is the undesired production of transient harmonics upon the passing from one component oscillation to the following one. Sharp transients, occurring upon a sudden change in amplitude, necessitate an overdimensioning of the generating devices as well as of the power circuits coupled thereto, in order to allow for a flow of excess current amounting to possibly ten times the rated capacity. Moreover, the circuits fed by such a wave synthesizer must be protected by filters and buffer capacitors against supply variations which may cause undesired distortions in the transmitted waveform.

Systems presently in use solve the aforestated problems only in part. Thus, for example, conventional synthesizers including computing elements and analog/-digital converters for determining the number of cycles of a generated waveform component are incapable of also controlling the initial and final phases of a waveform. Moreover, such devices are complex and have long processing times. Systems of the sample-and-hold type, using a capacitor for determining the point at which a given oscillation must be stopped, offer insufficient operating reliability and do not provide for the determination of the initial phase nor of the number of transmitted cycles of a waveform.

OBJECTS OF THE INVENTION

An important object of our present invention is to provide a waveform synthesizer which minimizes the production of transients.

Another object is to provide reliable means in such a synthesizer for producing a composite waveform with one or more component oscillations of predetermined initial and final phases separated by a preselected number of cycles.

SUMMARY OF THE INVENTION

A controlled generator of an alternating waveform comprises according to our present invention an oscillator transmitting to a multiplexer a periodic waveform and to an analog comparator a phase-indicating signal in the form of a substantially sawtooth-shaped voltage having the same period as the waveform sent to the multiplexer. A pulse for enabling a logic circuit is generated by the comparator upon detecting an equivalence of the sawtooth-shaped voltage and a predetermined potential supplied by a voltage source, the logic circuit controlling in response to the enabling pulse the switching of the periodic waveform onto an output of the multiplexer, whereby an oscillating voltage having a predetermined initial phase and a predetermined final phase is produced on the multiplexer output.

According to another feature of our invention, the generator further comprises a switching circuit operationally connected to the DC voltage source and to the logic circuit for generating a buffer signal having a form determined by the logic circuit, the switching circuit being linked to the multiplexer for delivering thereto the buffer signal which is switched onto the multiplexer output under the control of the logic circuit for providing the oscillating voltage with a preceding waveform portion and a succeeding waveform portion continuous with the oscillating voltage at either end, respectively. The switching circuit includes an RC subcircuit and a plurality of analog switches for generating an exponential signal transmitted to the multiplexer as part of the buffer signal.

According to a further feature of our invention, the voltage source includes a first manually adjustable potentiometer for controllably changing the level of the potential fed to the comparator, whereby different values may be selected for the initial phase and for the final phase of the output voltage of the multiplexer. A second potentiometer having a variation characteristic similar to a cyclic variation of the periodic waveform produced by the oscillator is operationally linked to an axis of the first potentiometer for varying, in accordance with selected values of the initial phase and final phase of the output voltage of the multiplexer, the level of a DC voltage fed to the switching circuit.

According to yet another feature of our invention, the logic circuit includes a memory for storing instructions in part specifying a plurality of periodic waveforms to be switched by the multiplexer onto its output. The waveforms are produced by a plurality of oscillators which feed to the comparator substantially sawtooth-shaped voltages indicating the phases of respective periodic waveforms, the comparator including an additional multiplexer operationally coupled with the logic circuit for selecting sawtooth-shaped voltages in accordance with the memorized instructions, whereby the comparator generates a train of pulses enabling the logic.

Pursuant to another feature of our invention, the comparator includes a first comparator having a noninverting input receiving from the oscillator the sawtooth-shaped voltage and a second comparator having a noninverting input receiving the potential from the voltage source. The noninverting input of the first comparator is connected to an inverting input of the second comparator, while the noninverting input of the second comparator is connected via a diode to the inverting input of the first comparator for generating a control pulse on a common lead extending from the comparators to the logic circuit.

Pursuant to still another feature of our invention, the logic circuit includes a counter for enabling the cut-off of the periodic waveform from the multiplexer output only upon counting a predetermined number of cycles transmitted onto the output. The generator further comprises a circuit for converting a synchronizing signal from the oscillator into a pulse train for stepping the counter in the logic circuit, the synchronizing signal and the pulse train having the same period as the waveform sent to the multiplexer from the oscillator.

Pursuant to yet a further feature of our invention, the oscillator includes a field-effect transistor connected in a biasing network for producing from a triangular-wave input a sinusoidal oscillation comprising the periodic waveform.

Pursuant to yet another feature of our invention, the comparator may include a potentiometer for adjusting the level of the potential from the voltage source in order to compensate for processing delays in the logic circuit.

BRIEF DESCRIPTION OF THE DRAWING

These and other features of our invention will now be described in detail, reference being made to the accompanying drawing in which.

SPECIFIC DESCRIPTION

Figure 1:
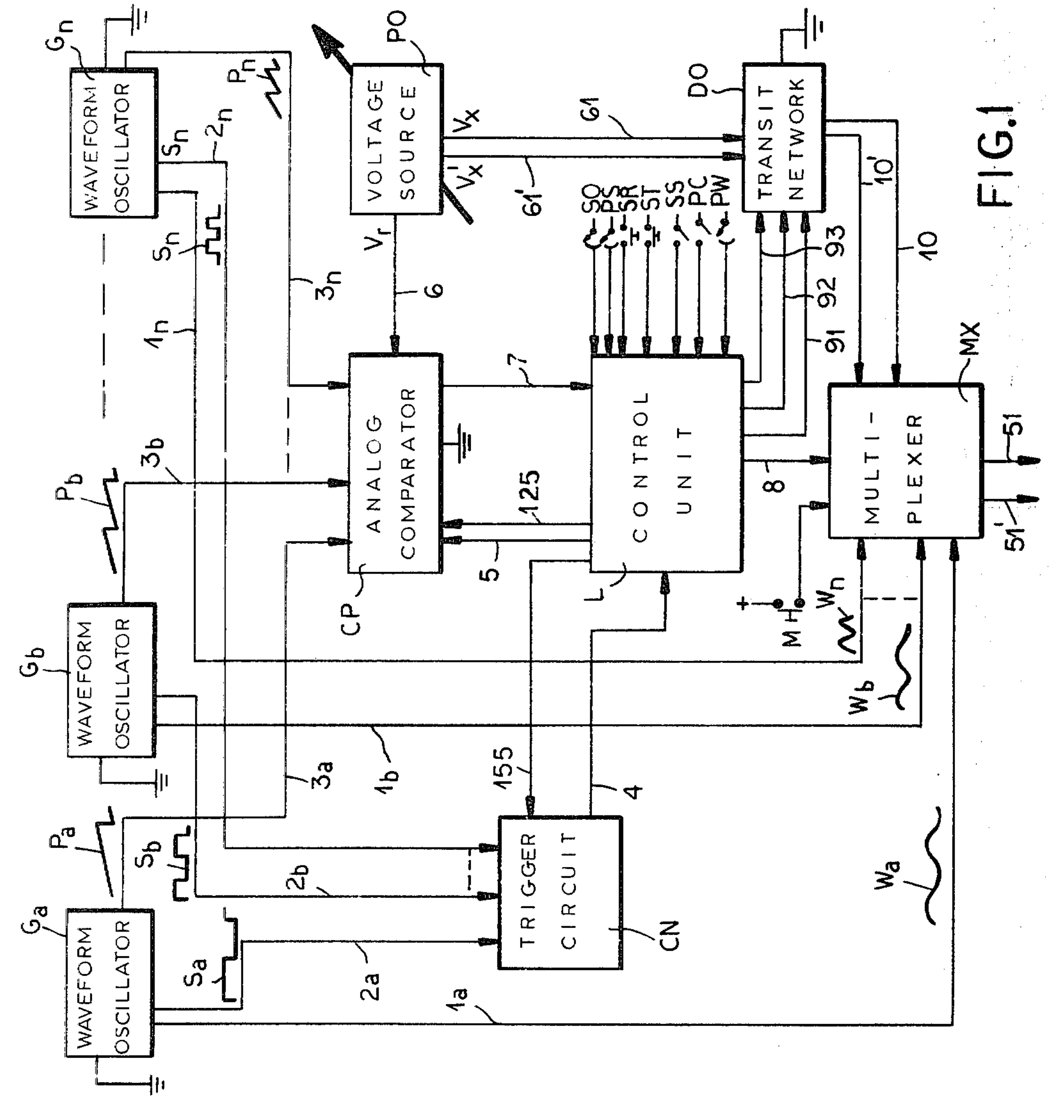
FIG. 1 is a block diagram of a controlled waveform synthesizer according to our invention, showing a plurality of oscillators, an analog comparator, a transit network, a voltage source, a control unit, a multiplexer and a trigger circuit.

As illustrated in FIG. 1, a waveform synthesizer according to our present invention comprises a plurality of oscillators $G_a$, $G_b$, . . . $G_n$ for producing sine waves $W_a$, $W_b$, . . . $W_n$ of different frequencies transmitted to a multiplexer MX on respective output leads forming part of multiples $\mathbf{1}_a$, $\mathbf{1}_b$, . . . $\mathbf{1}_n$. On other leads $\mathbf{2}_a$, $\mathbf{2}_b$, . . . $\mathbf{2}_n$, extending to a trigger circuit CN, oscillators $G_a$, $G_b$, . . . $G_n$ emit synchronizing signals $S_a$, $S_b$, . . . $S_n$ in the form of square waves having the same frequencies as sine waves $W_a$, $W_b$, . . . $W_n$, respectively, while further leads $\mathbf{3}_a$, $\mathbf{3}_b$, . . . $\mathbf{3}_n$ feed an analog comparator CP with sawtooth-shaped signals or ramp voltages $P_a$, $P_b$, . . . $P_n$ whose instantaneous magnitudes correspond unequivocally to the phases of waves $W_a$, $W_b$, . . . $W_n$, respectively. Multiples $\mathbf{1}_a$, $\mathbf{1}_b$, . . . $\mathbf{1}_n$ include additional leads carrying other oscillations of the same frequency as sine waves $W_a$, $W_b$, . . . $W_n$ as described hereinafter with reference to FIG. 2.

Comparator CP, in response to a command received over a multiple 5 from a control unit L, selects a generic ramp voltage $P_i$ from one of the leads $\mathbf{3}_a$, $\mathbf{3}_b$, . . . $\mathbf{3}_n$ for comparison with another ramp signal from a second such lead or with a d-c potential $V_r$ carried by a lead 6 from a voltage supply PO. Upon detecting an instantaneous equality of the two input voltages under consideration, comparator CP forwards to control unit L via an output lead 7 an enabling signal in the form of a binary pulse subsequently converted by logic circuitry in unit L to an instruction sent to multiplexer MX via a multiple 8 whereby an output lead 51 of the multiplexer, previously connected to a lead of one of the multiples $\mathbf{1}_a$, $\mathbf{1}_b$, . . . $\mathbf{1}_n$, is switched either to another of these multiples or to an output lead 10 of a transit network DO emitting a constant or aperiodically varying voltage as more fully described hereinafter.

In response to a binary signal received from control unit L on a multiple 155, trigger circuit CN selects a synchronizing signal from among the square waves $S_a$, $S_b$, . . . $S_n$ on leads $\mathbf{2}_a$, $\mathbf{2}_b$, . . . $\mathbf{2}_n$ and converts the selected signal into a pulse train of like cadence fed on a lead 4 to control unit L for stepping a cycle counter CT (FIG. 7) therein.

The operation of the waveform synthesizer of FIG. 1 is determined by a number of manual switches SO, PS, SR, ST, SS, PC, PW located on an external control panel and connected to unit L. By manipulating rotary switch SO, an operator selects oscillations from one or more of the generators $G_a$–$G_n$ for sequential inclusion in a synthesized waveform to appear on lead 51 and, possibly, a similar waveform in quadrature therewith to appear to a companion lead 51′. Whether the selected oscillations are to be automatically cut off by the control unit L after a certain number of cycles or are to be terminated by the operator's manipulation of pushbutton switch ST is determined by the setting of on-off switch SS. If the cutoff of a particular oscillation is to be automatic, the number of cycles transmitted is preselected by rotary switch PS. Opening on-off switch PC instructs unit L to separate selected oscillations by d-c voltages $V_x$ and $V_x'$ fed to multiplexer MX from supply PO via leads 61 and 61′, network DO and leads 10 and 10′. Pushbutton switch SR sends a starting signal to unit L; rotary switch PW serves for the selection of any of the wave shapes available on the leads of multiples $\mathbf{1}_a$–$\mathbf{1}_n$.

Figure 6:
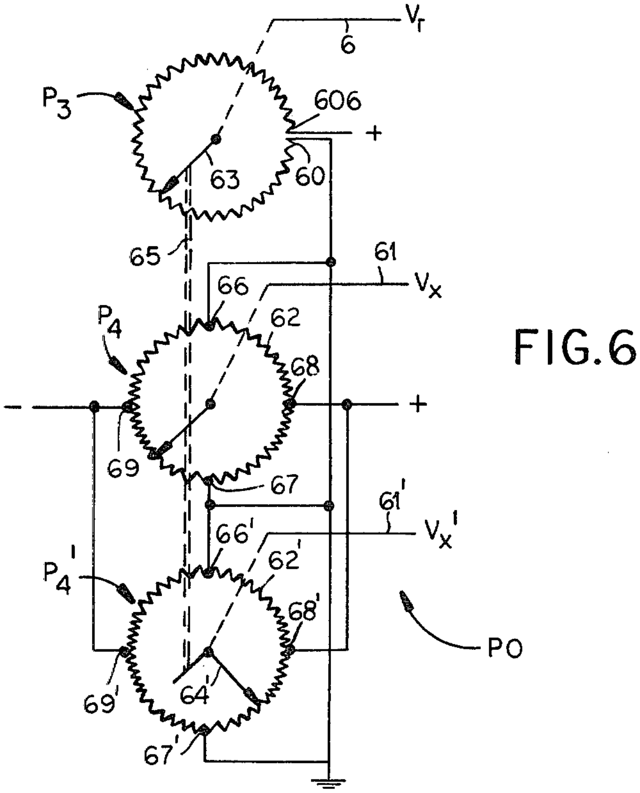
FIG. 6 is a circuit diagram of the voltage source shown in FIG. 1.

Voltage source PO is a manually controlled potentiometric unit supplying the d-c potential $V_r$ used by comparator CP as a reference or standard for selecting an initial and a final phase of a multicycle oscillation called forth by the setting of switch SO. Basically, as illustrated in FIG. 6, unit PO comprises a linear potentiometer $P_3$ for generating potential $V_r$ and two other potentiometers $P_4$, $P_4'$ ganged together as indicated at 65. Resistance windings 62 and 62′ of potentiometers $P_4$ and $P_4'$ are connected to ground at diametrically opposed contacts 66, 67 and 66′, 67′, to a positive potential at contacts 68 and 68′ and to a negative potential at contacts 69 and 69′, winding 62 being bunched in the regions of contacts 68, 69 to provide potentiometer $P_4$ with a sinusoidal characteristic. Potentiometer $P_4'$ with its winding 64' bunched in the regions of contacts 68', 69' has an armature 64' fixed at an angle of 90° with respect to an armature 64 of potentiometer $P_4$ to provide a sinusoidal characteristic lagging the characteristic of potentiometer $P_4$ by 90°. Thus, the d-c voltages $V_x$, $V_x'$ carried by leads 61, 61' vary in accordance with respective cycles of quadrature sine waves as d-c potential $V_r$ is increased from zero to its maximal value by the rotation of an armature 63 of potentiometer $P_3$ from alignment with a grounded winding terminal 60 to alignment with another terminal 606 connected to a positive potential.

In the case that rotary switch PW is used to select a ramp voltage $P_a-P_n$ to appear on output lead 51, the d-c potential $V_r$ produced by potentiometer $P_3$ may be tapped for transmission to network DO. Included in voltage source PO is another potentiometer (not shown) having a characteristic varying in accordance with one cycle of a triangular wave, this potentiometer being connected to lead 61 in the event that a triangular wave is selected for emission on lead 51.

Unit L has, besides multiples 5, 8 and 155, three output leads 91, 92, 93 extending to network DO for determining the forms of the aperiodic signals on leads 10, 10', these signals being constant at zero or at the levels of voltages $V_x$, $V_x'$ or varying exponentially between zero and $V_x$, $V_x'$, respectively. Another output lead 125 feeds analog conparator CP with instructions for monitoring a generic ramp signal $P_i$ in relation to d-c potential $V_r$ or in relation to another ramp voltage.

Figure 2:
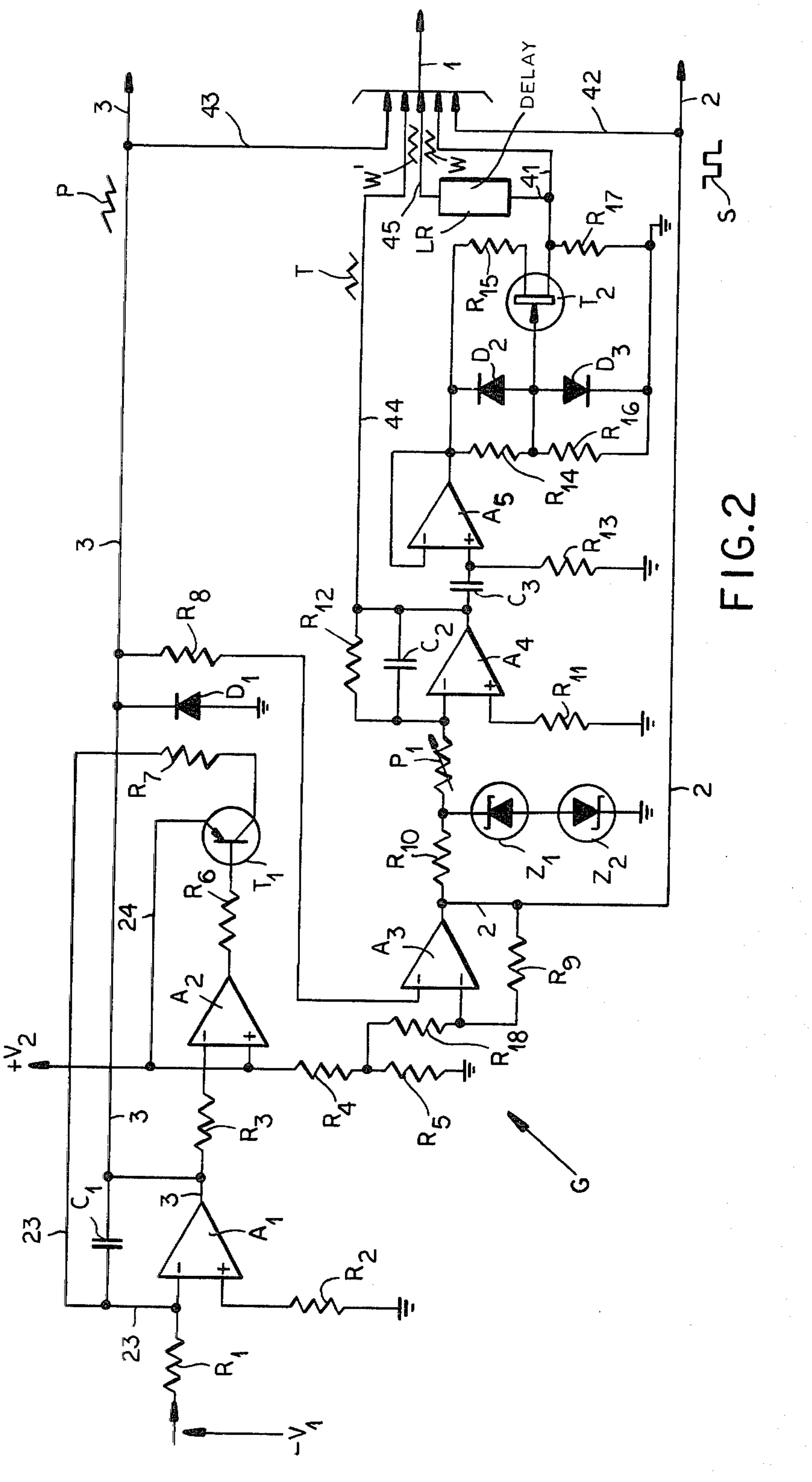
FIG. 2 is a circuit diagram of an oscillator shown in FIG. 1.

As illustrated in FIG. 2, an oscillator G representing any of the oscillators $G_a$, $G_b$ . . . $G_n$ comprises five operational amplifiers $A_1$–$A_5$, three capacitors $C_1$–$C_3$, five diodes $D_1$–$D_3$, $Z_1$, $Z_2$, two transistors $T_1$ and $T_2$, a delay circuit LR and 19 resistors $R_1$–$R_{18}$, $P_1$, resistor $P_1$ being manually adjustable. A noninverting input of amplifier $A_1$ is connected to ground via resistor $R_2$ while a voltage source supplies by means of resistor $R_1$ a negative potential $-V_1$ to the inverting output of amplifier $A_1$, this input also receiving feedback from an output lead 3 through capacitor $C_1$. Amplifier $A_1$ acts as an integrator producing a positive ramp voltage P (representing a voltage $P_a$, $P_b$. . . $P_n$ generated by oscillator $G_a$, $G_b$. . . $G_n$) transmitted by resistor $R_3$ to the inverting input of amplifier $A_2$ for comparison with a positive potential $+V_2$ conducted from an external source to the noninverting input of amplifier $A_2$. As long as ramp voltage P is less in magnitude than potential $V_2$, PNP transistor $T_1$, whose base is connected via resistor $R_6$ to an output of amplifier $A_2$ and whose emitter receives potential $V_2$ on a lead 24, remains nonconductive. When ramp voltage P is equal to potential $V_2$, the output of amplifier $A_2$ turns negative, inducing transistor $T_1$ to conduct potential $V_2$ through resistor $R_7$ and a lead 23 to the inverting input of amplifier $A_1$, whereupon the output of amplifier $A_1$ is reset to zero. Then amplifier $A_2$ is also reset to have an output greater than the magnitude of potential $V_2$, thus returning transistor $T_1$ to a nonconductive state and starting another cycle in the generation of ramp voltage P. Output lead 3 (representing an output lead $3_a$, $3_b$. . . $3_n$ associated with oscillator $G_a$, $G_b$ . . . $G_n$) is grounded by means of diode $D_1$ for insuring the positivity of ramp voltage P.

Acting as a voltage comparator, amplifier $A_3$ receives on its inverting input through resistor $R_8$ the ramp voltage P and on its noninverting input through resistor $R_{18}$ the potential $V_2$ halved by voltage divider $R_4$, $R_5$. Amplifier $A_3$ produces on an output lead 2 (representing a lead $2_a$, $2_b$ . . . $2_n$ associated with oscillator $G_a$, $G_b$ . . . $G_n$) a square wave S having a positive value while the voltage level of the inverting input is greater than that of the noninverting input and negative otherwise, square wave S having the same period as ramp voltage P. Resistors $R_{18}$ and $R_9$ co-operate in a known way to determine the correct bias of the noninverting input of amplifier $A_3$.

Clipped into a symmetrical shape by resistor $R_{10}$ and Zener diodes $Z_1$, $Z_2$, square wave S is conducted over potentiometer $P_1$ to the inverting input of amplifier $A_4$, this input being also connected in a feedback loop to an output lead 44 by means of resistor $R_{12}$ and capacitor $C_2$. Amplifier $A_4$ is grounded at its noninverting input via resistor $R_{11}$ and acts as an integrator delivering a triangular wave T through DC-filtering capacitor $C_3$ to the grounded (over resistor $R_{13}$) noninverting input of current amplifier $A_5$.

Connected to an output lead of amplifier $A_5$ is a conversion network including field-effect transistor $T_2$ bridged in part by germanium diodes $D_2$, $D_3$ and biased by resistors $R_{14}$–$R_{17}$ so as to have a symmetrical bidirectional characteristics similar in an interval about the origin to a sine function. Thus two positive, increasing and decreasing, half periods of the amplified triangular waveform T are converted into a positive half wave of a sinusoid W emitted on an output lead 41, while two negative, decreasing and increasing, half periods of waveform T are converted into a negative half wave of sinusoid W.

Unit LR is a conventional delay line for causing in the sinusoidal signal W received from lead 41 a phase shift of a quarter period to produce on an output lead 45 a second sinusoid W' in phase quadrature with signal W. Leads 41 and 45 together the lead 44 and two additional leads 42, 43 carring square wave S and ramp voltage P, respectively, constitute a multiple 1 extending to multiplexer MX (FIGS. 1 and 8) which is constructed to emit on output 51 any combination of the signals carried by connection 1, including waveform W alone or no signal at all, as determined by control unit L.

Figure 3:
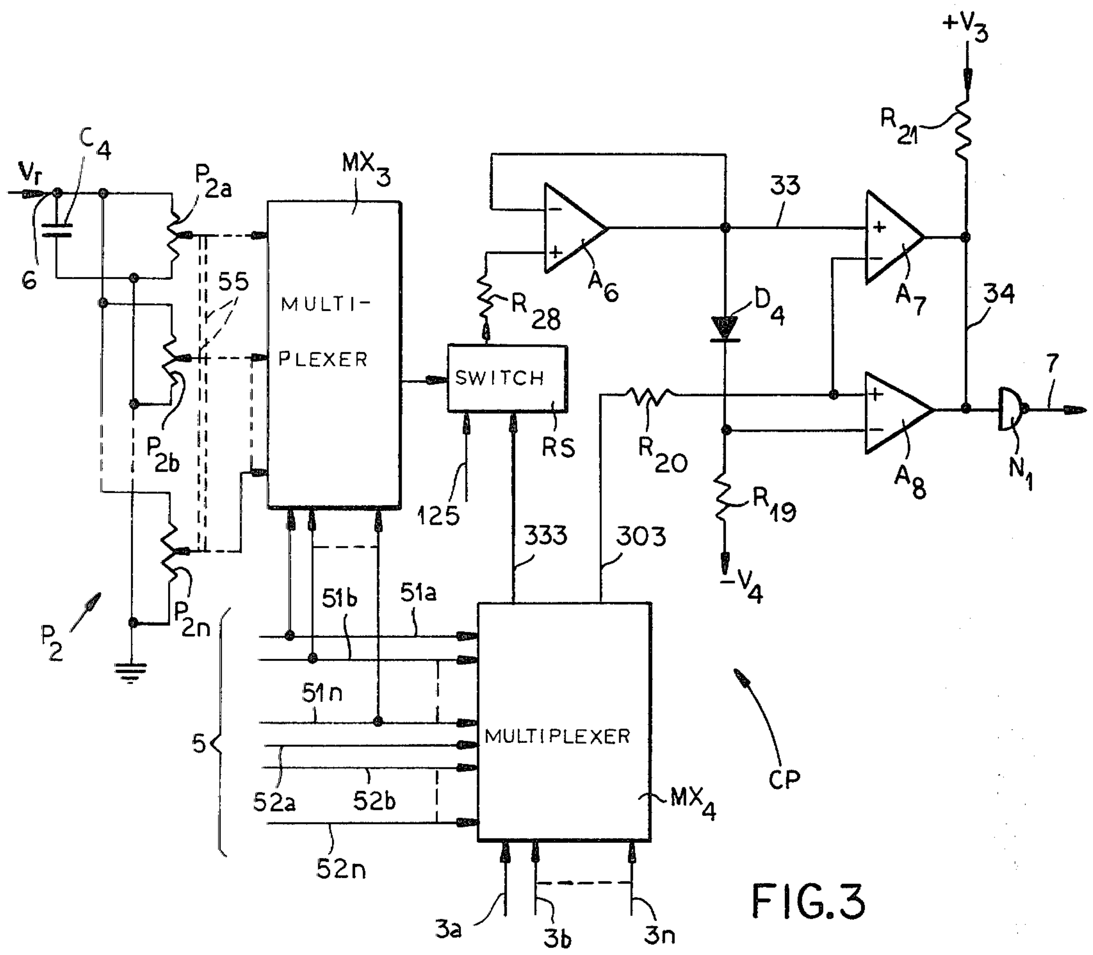
FIG. 3 is a partial circuit diagram of the analog comparator shown in FIG. 1.

As shown in FIG. 3, monitoring circuit CP includes a pair of operational amplifiers $A_7$, $A_8$ functioning as comparators having cross-connected inputs for emitting respective square-wave signals generally opposed to one another in polarity, the comparators being biased at their inputs by a negative potential $-V_4$ via a resistor $R_{19}$ and at their outputs by a positive potential $+V_3$ via a resistor $R_{21}$ and a lead 34. By means of a resistor $R_{20}$ and a lead 303 a multiplexer $MX_4$ delivers to the noninverting input of comparator $A_8$ a ramp voltage selected from among the signals arriving on input lead $3_a$, $3_b$. . . $3_n$, according to a command sent from unit L on leads $51_a$, $51_b$. . . $51_n$ forming paert of multiple 5. A switch RS responding to a signal carried on lead 125 feeds to the noninverting input of comparator $A_7$ and the inverting input of comparator $A_8$ either the d-c potential $V_r$ arriving on lead 6 from source PO (FIG. 1) or another ramp voltage selected by multiplexer $MX_4$ in response to command signals emitted by unit L on leads $52_a$, $52_b$. . . $52_n$ also included in multiple 5, this additional ramp voltage being fed to switch RS via a lead 333. The signal transmitted by switch RS is conducted to the noninverting input of a current amplifier $A_6$ through a resistor $R_{28}$ equal to the input impedance of unit $A_6$. Comparator $A_7$ receives the output voltage of current amplifier $A_6$ directly on a lead 33, while comparator $A_8$ receives the output voltage slightly diminished in magnitude, owing to a small voltage drop across a diode $D_4$. This small difference in voltage level between the noninverting input of comparator $A_7$ and the inverting input of comparator $A_8$ induces same to change the polarity of its output signal slightly before comparator $A_7$ changes its output, generating on lead 34 a very brief spike sharpened by passing through an inverter $N_1$ before emission on lead 7 to control unit L. Thus, if a ramp voltage from one of the oscillators $G_a$, $G_b$ . . . $G_n$ is being monitored in relation to the d-c potential from voltage source PO, a well-gauged control pulse is emitted on lead 7 immediately prior to the instant at which the compared signals are equal. The time at which the control pulse is emitted may be advanced, in order to compensate for processing delays in the control unit, by manually adjusting a potentiometric unit $P_2$ linking line 6 to switch RS. Unit $P_2$ comprises n axially ganged (as symbolized by two dashed lines 55) potentiometers $P_{2a}$, $P_{2b}$ . . . $P_{2n}$ having linear characteristics with slopes proportional to the frequencies of the output waveforms of oscillators $G_a$, $G_b$ . . . $G_n$, respectively. Output voltages of potentiometers $P_{2a}$, $P_{2b}$ . . . $P_{2n}$ are selectively delivered to switch RS by a multiplexer $MX_3$ under the control of the signals present on leads 51$_a$, 51$_b$ . . . 51$_n$. A capcitor $C_4$ is linked in parallel to unit $P_2$ for filtering to ground any spurious AC components in the signal arriving on lead 6.

Figure 4:
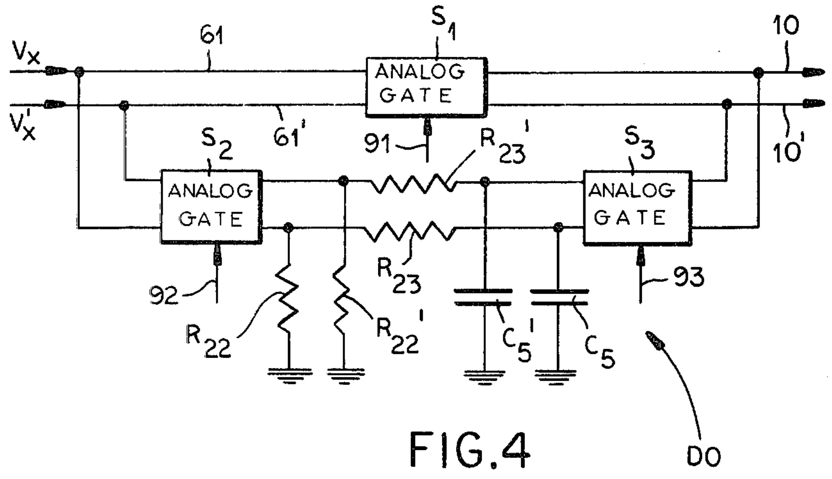
FIG. 4 is a circuit diagram of the transit network illustrated in FIG. 1.

In FIG. 4 we have shown network DO as comprising three analog gates $S_1$, $S_2$, $S_3$ which are opened or closed according to the values of binary signals present on respective leads 91, 92, 93. The transit network DO further includes a first RC subcircuit with resistor elements $R_{22}$ and $R_{23}$ and a capacitor $C_5$ for generating a first exponential voltage transmitted on lead 10 to multiplexer MX (FIGS. 1 and 8) and a second RC subcircuit with resistors $R_{22}'$ and $R_{23}'$ and a capacitor $C_5'$ for generating a second exponential voltage transmitted on lead 10' to multiplexer MX. If all three gates $S_1$, $S_2$, $S_3$ are initially closed for a time interval long enough to discharge capacitors $C_5$, $C_5'$, then exponential signals increasing or decreasing from zero, depending on whether the d-c voltages $V_x$, $V_x'$ on lines 61, 61' are positive or negative, will be produced on lines 10, 10' upon the opening of gates $S_2$ and $S_3$ (gate $S_1$ remaining closed). On the other hand, if all three gates are initially open for a time interval long enough to charge capacitors $C_5$, $C_5'$ to the levels of voltages $V_x$, $V_x'$, respectively, then exponential signals decreasing or increasing from the potentials of lines 61, 61', again depending on whether lines 61, 61' are positive or negative, will be produced on output leads 10, 10' upon the closure of gates $S_1$ and $S_2$ (gate $S_3$ remaining open). Thus, by properly controlling the gates, unit L may gradually vary the outputs of network DO between zero and the values of the voltage $V_x$, $V_x'$, the rate of output-voltage change being predetermined by the time constants of RC subcircuits $R_{22}$, $R_{23}$, $C_5$ and $R_{22}'$, $R_{23}'$, $C_5'$.

Figure 7:
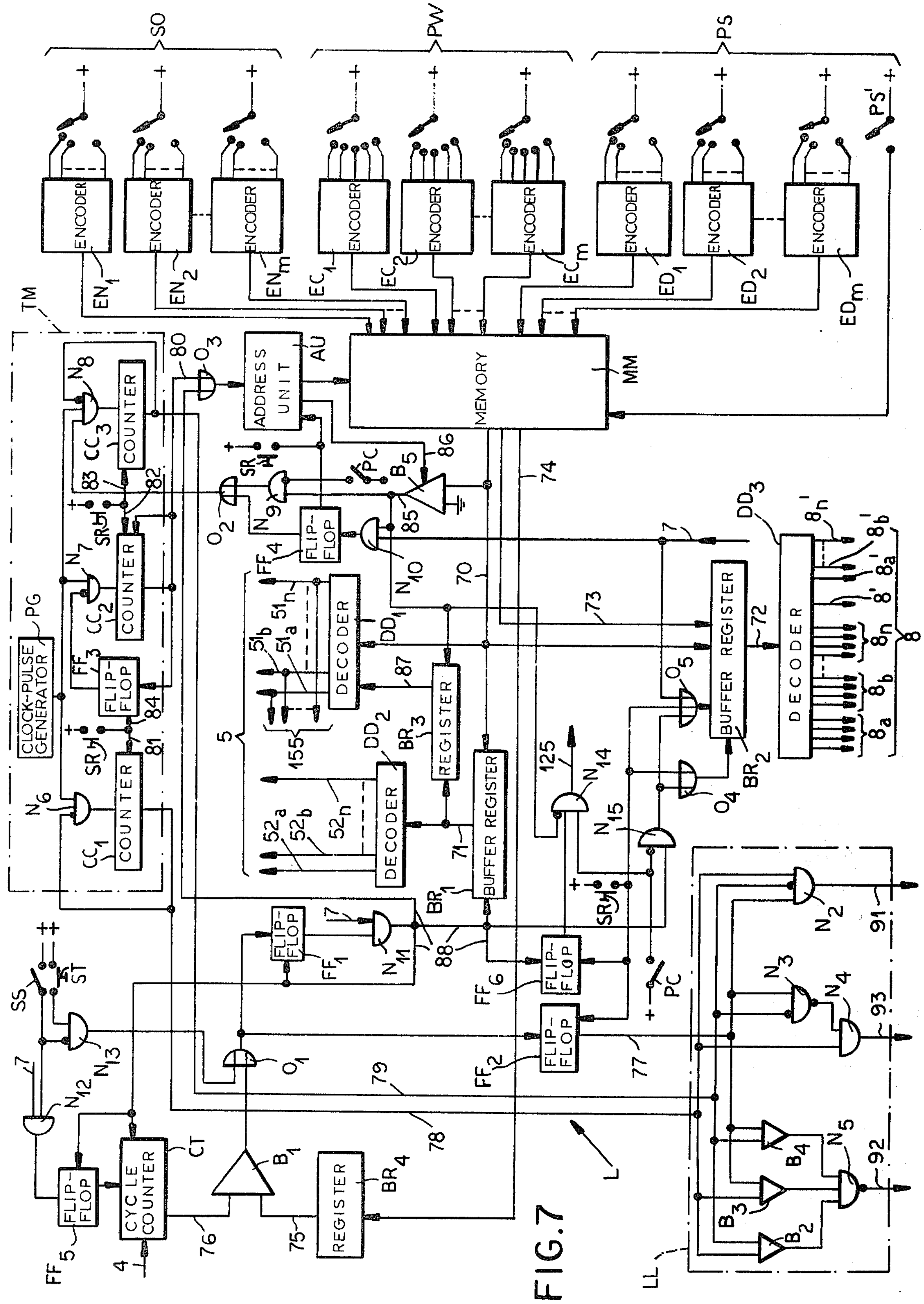
FIG. 7 is a block diagram of the control unit shown in FIG. 1.

As illustrated in FIG. 7, control unit L comprises a memory MM temporarily storing commands generated upon manipulation of switches SO, PW, PS and converted into binary pulse trains by 3m encoders $EN_1$, $EN_2$ . . . $EN_m$, $EC_1$, $EC_2$ . . . $EC_m$, $ED_1$, $ED_2$ . . . $ED_m$. Switch SO includes m rotary switches each with n poles connected to a respective encoder $EN_1$, $EN_2$ . . . $EN_m$ (n, the number of waveform oscillators $G_a$, $G_b$ . . . $G_n$, is generally unequal to m), while switch PW has m rotary switches each having five bank contacts or poles linked to a respective encoder $EC_1$, $EC_2$ . . . $EC_m$, thereby providing for the selection of a waveform shape from among five possible outputs of oscillators $G_a$, $G_b$, . . . $G_n$. The numbers of poles of rotary subunits of switch PS determine the maximum number of cycles of waveforms that can be selected by switches SO and PW for transmission to the output of the waveform synthesizer of FIG. 1. The command instructions fed to memory MM by encoders $EN_1$, $EN_2$ . . . $EN_m$ are read under the control of an address unit AU onto an output lead 70 extending to a decoder $DD_1$ and to a pair of buffer registers $BR_1$ and $BR_2$, register $BR_1$ having an output lead 71 working into a second decoder $DD_2$ and a third buffer register $BR_3$; and register $BR_2$ has an output lead 72 feeding yet another decoder $DD_3$. The instructions fed into memory MM by encoders $EC_1$, $EC_2$ . . . $EC_m$ are read under the control of address unit AU onto a lead 73 which forms a second input of register $BR_2$, while the instructions loaded into the memory by encoders $ED_1$, $ED_2$ . . . $ED_m$ are emitted under the conrol of unit AU onto a lead 74 extending to a fourth buffer register $BR_4$, this register applying its contents via a multiple lead 75 to an input of a multiple-stage binary comparator $B_1$. Comparator $B_1$ receives on another multiple input 76, from a counter CT, binary signals specifying the number of cycles of a waveform transmitted onto output lead 51 of multiplexer MX (FIG. 1). Upon detecting a positive comparison between the signals present on leads 75 and 76, comparator $B_1$ forwards a signal of logic level "1" through an OR gate $O_1$ to a pair of flip-flops $FF_1$ and $FF_2$. Flip-flop $FF_2$ has an output lead 77 extending to a logic circuit LL which is provided with two further input leads 78, 79 extending from a timer circuit TM. Lead 78 forms an input for a pair of binary comparators $B_2$, $B_3$ and a pair of AND gates $N_2$, $N_4$, comparators $B_2$, $B_3$ having second inputs fed by leads 79, 77, respectively. A third comparator $B_4$ with input leads 77, 79 works, together with comparators $B_2$, $B_3$, into a NAND gate $N_5$ whose output lead 92 extends to transit network DO (FIGS 1 and 4). AND gate $N_2$ has a second input connected to lead 77 and a negated third input connected to lead 79, while AND gate $N_4$ has a second input fed by a NAND gate $N_3$ having a first input linked to lead 77 and a negated second input linked to lead 79. Output leads of AND gates $N_2$, $N_4$ constitute lines 91, 93 extending to network DO from unit L for controlling the opening and closing of gates $S_1$, $S_3$ (FIG. 4).

Timer TM (FIG. 7) includes a clock-pulse generator PG stepping three binary counters $CC_1$, $CC_2$, $CC_3$ via respective AND gates $N_6$, $N_7$, $N_8$ each provided with a negated input connected to an output lead of the associated counter for blocking the stepping pulses from generator PG upon the reaching of the predetermined counter level by the counter. Thus, lead 78 tied to the output of counter $CC_1$ is connected to the negated input of AND gate $N_6$, while lead 79 extending from an output of counter $CC_3$ is connected to the negated input of AND gate $N_8$ which has a third input coupled with an OR gate $O_2$ for blocking the stepping of counter $CC_3$ until a last set of coded commands have been read from memory MM, as explained in detail hereinafter. Counter $CC_2$ has an output lead 80 working into an OR gate $O_3$ and into a flip-flop $FF_3$, OR gate $O_3$ stepping address unit AU whereas flip-flop $FF_3$ feeds the negated input of AND gate $N_7$. Counters $CC_1$, $CC_2$, $CC_3$ and flip-flop $FF_3$ have respective reset inputs 81, 82, 83, 84 activated by pushbutton switch SR, a resetting input of counter $CC_2$ being also energized by the signal present on lead 80.

OR gate $O_2$ receives input signals from a flip-flop $FF_4$ and an AND gate $N_9$, this gate in turn having a negated input connected to on-off switch PC and a second input connected to a lead 85 extending from a multiple-stage binary comparator $B_5$ having one input grounded and another input linked to lead 70 for producing a signal of logic level "1" on lead 85 upon detecting a zero output from memory MM. Comparator $B_5$ is actuated by address unit AU via a lead 86. Flip-flop $FF_4$ is set by a signal present at the output of an AND gate $N_{10}$ which has an input coupled with lead 85 and another input coupled with lead 7 (see FIGS. 1 and 3); flip-flop $FF_4$ is reset along with address unit AU by closing pushbutton switch SR. Lead 85 also extends to register $BR_3$ for inducing the reading of the register's contents onto a lead 87 working into decoder $DD_1$. An AND gate $N_{11}$ having one input coupled with an output of flip-flop $FF_1$ and another input connected to lead 7 has an output lead 88 extending to OR gate $O_3$ for stepping address unit AU and to buffer register $BR_1$ for reading the contents thereof onto lead 71. Lead 88 is also connected to reset inputs of flip-flop $FF_1$ and counter CT and to a reset input of a flip-flop $FF_5$ whose output works into an enabling input of counter CT. Flip-flop $FF_5$ is set by a signal transmitted from an AND gate $N_{12}$ provided with a pair of inputs energized by a pulse on lead 7 and by a signal of logic level "1" generated upon the closing of switch SS, respectively, switch SS also being linked to a negated input of yet another AND gate $N_{13}$ having a second input activated by pushbutton ST and having an output lead extending to OR gate $O_1$.

Lead 88 is connected to a setting input of a flip-flop $FF_6$ having an output lead 89 extending to an AND gate $N_{14}$ which has a negated second input linked to lead 85 and a third input energized by closing on-off switch PC. The output voltage of AND gate $N_{14}$ is transmitted onto lead 125 extending to analog comparator CP for controlling switch RS (FIG. 3). Another AND gate $N_{15}$ with a negated input energizable by switch PC and another input coupled with lead 88 works into a pair of OR gates $O_4$, $O_5$ connected at their outputs to a resetting input and to an enabling input, respectively, of buffer register $BR_2$. OR gate $O_5$ is linked at an input to lead 7, while both OR gates $O_4$ and $O_5$ have inputs activated by a start command from switch SR, this command also being fed to resetting inputs of flip-flops $FF_2$, $FF_4$, $FF_6$ and to a resetting input of address unit AU.

Output leads 51*a*, 51*b* . . . $\mathbf{51}_n$ from decoder $DD_1$ and leads $\mathbf{52}_a$, $\mathbf{52}_b$ . . . $\mathbf{52}_n$ from decoder $DD_2$ extend in multiple 5 from control unit L to multiplexers $MX_3$ and $MX_4$ in monitoring circuit CP (FIG. 3). Output line 8 is a multiple including submultiples $\mathbf{8}_a$, $\mathbf{8}_b$ . . . $\mathbf{8}_n$ and leads 8', $\mathbf{8}_a'$ . . . $\mathbf{8}_n'$ which work into subunits of multiplexer MX (FIG. 1), as explained in detail hereinafter. Leads 51*a*, $\mathbf{51}_b$ . . . $\mathbf{51}_n$ branch within control unit L to form multiple 155 extending to trigger circuit CN (FIG. 1).

Figure 8:
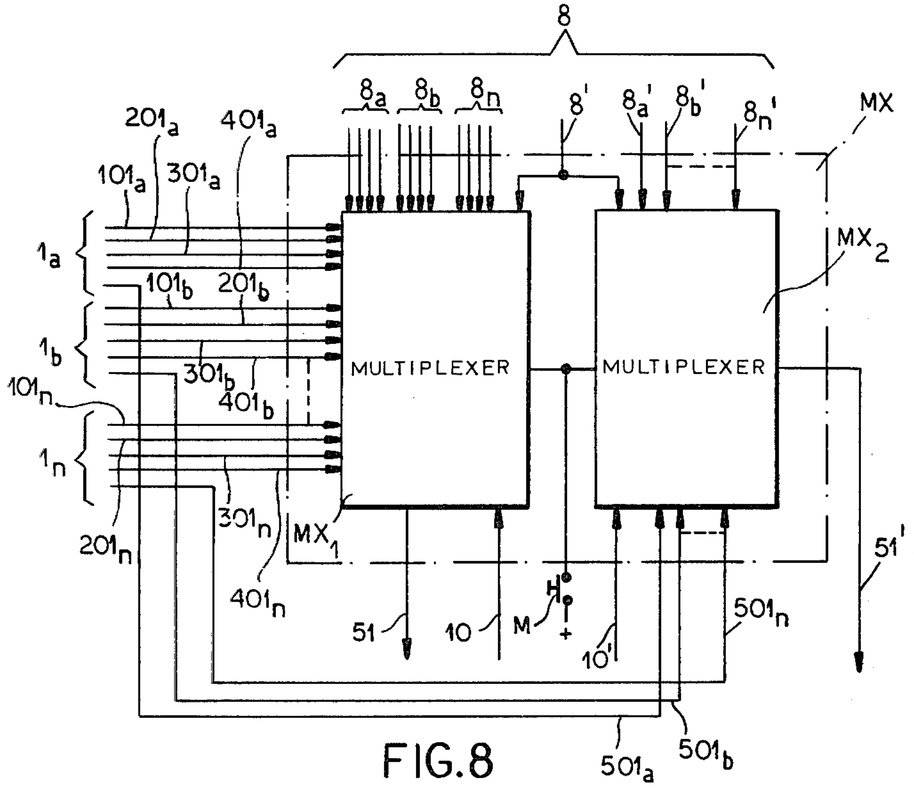
FIG. 8 is a block diagram of the multiplexer illustrated in FIG. 1.

As illustrated in detail in FIG. 8, multiplexer MX includes two multiplexing units $MX_1$ and $MX_2$ with output leads 51 and 51' respectively. Multiplexer $MX_1$ receives from oscillators $G_a$, $G_b$ . . . $G_n$ on leads $\mathbf{101}_a$, $\mathbf{101}_b$ . . . $\mathbf{101}_n$ sawtooth voltages, on leads $\mathbf{201}_a$, $\mathbf{201}_b$ . . . $\mathbf{201}_n$ triangular waveforms, on leads $\mathbf{301}_a$, $\mathbf{301}_b$ . . . $\mathbf{301}_n$ sinusoidal voltages and on leads $\mathbf{401}_a$, $\mathbf{401}_b$, $\mathbf{401}_n$ square waves, switched onto output 51 in response to instructions transmitted via multiples $\mathbf{8}_a$, $\mathbf{8}_b$ . . . $\mathbf{8}_n$. Generic leads $\mathbf{101}_j$, $\mathbf{201}_j$, $\mathbf{301}_j$, $\mathbf{401}_j$ constitute a multiple $\mathbf{1}_j$ (not illustrated specifically) and carry oscillating voltages of the same frequency generally different from the frequencies carried by multiples extending from other oscillators. Multiplexer $MX_2$ receives on leads $\mathbf{501}_a$, $\mathbf{501}_b$ . . . $\mathbf{501}_n$ sinusoidal voltages in phase quadrature with the signals carried by leads $\mathbf{301}_a$, $\mathbf{301}_b$ . . . $\mathbf{301}_n$, respectively, the sinusoidal voltages on leads $\mathbf{501}_a$, $\mathbf{501}_b$ . . . $\mathbf{501}_n$ being switched onto output 51' under the control of signals fed to multiplexer $MX_2$ on leads $\mathbf{8}_a'$, $\mathbf{8}_b'$, . . . $\mathbf{8}_n'$. Multiplexers $MX_1$, $MX_2$ receive from transit network DO aperiodic voltages on leads 10, 10' selectively connected to outputs 51, 51' as determined by an instruction carried by lead 8'. A pushbutton switch M, also illustrated in FIG. 1, is connected to both multiplexers $MX_1$, $MX_2$ for feeding thereto a "reset" command prior to the beginning of waveform synthesis.

Figure 9:
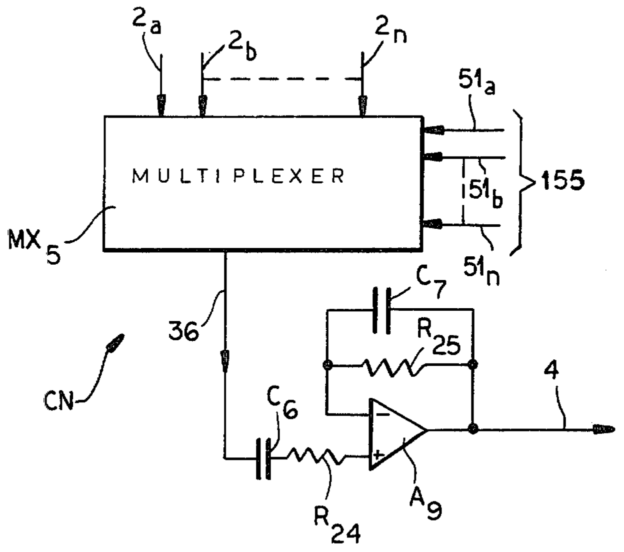
FIG. 9 is a partial block diagram of the trigger circuit shown in FIG. 1.

In FIG. 9 we have shown details of trigger dircuit CN. Under the control of logic pulses arriving on multiple 155, a multiplexer $MX_5$ transmits onto an output lead 36 a synchronizing signal selected from input leads $\mathbf{2}_a$, $\mathbf{2}_b$ . . . $\mathbf{2}_n$. Lead 36 is linked via a filtering capacitor $C_6$ and a resistor $R_{24}$ to the noninverting input of an operational amplifier $A_9$ whose inverting input is connected to output lead 4 via a capacitor $C_7$ in parallel with a resistor $R_{25}$. Amplifier $A_9$ acts as a differentiator converting a selected square-wave synchronizing signal into a logic-pulse train carried on lead 4 to counter CT (FIG. 7).

Figure 5:
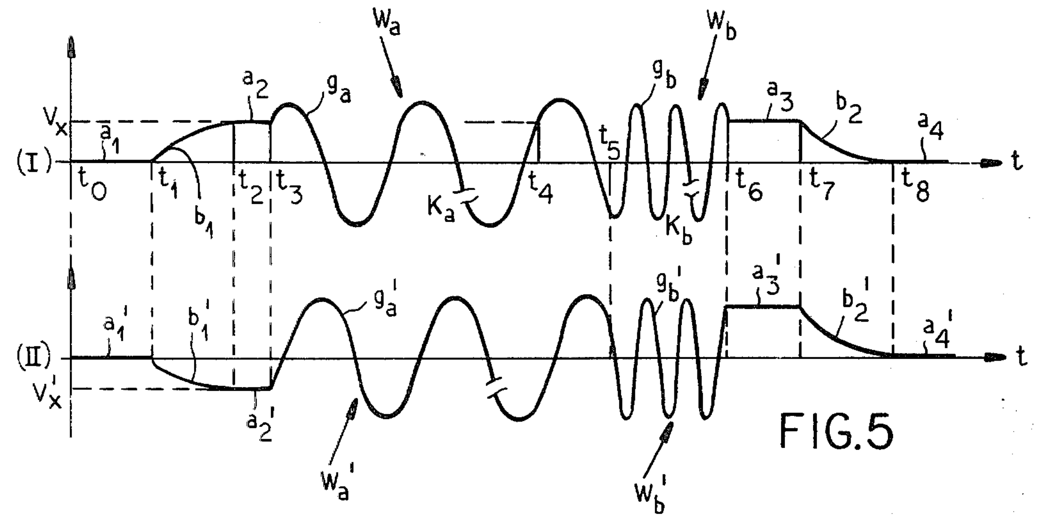
FIG. 5 is a pair of graphs showing two composite waveforms in phase quadrature with one another produced by the synthesizer illustrated in FIG. 1.

It will now be convenient, in describing the operation of a controlled waveform generator according to our invention, to refer to the time diagram of FIG. 5 showing in a first graph I a sample composite waveform which may be emitted on output lead 51. The composite waveform of graph I includes a first sine wave $g_a$ extending for an integral number of periods $K_a$ between two time instants $t_3$ and $t_4$ to continue for a portion of a cycle to a time $t_5$ when a second sine wave $g_b$ begins, having an amplitude equal to that of sine wave $g_a$ and extending for approximately a half cycle more than an integral number of periods $K_b$ to an instant in time $t_6$. Between time $t_6$ and a time $t_7$, sine wave $g_b$ is succeeded by a constant waveform portion $a_3$ having a magnitude $V_x$, while between time $t_7$ and a time $t_8$ the output voltage drops in an exponental decay $b_2$ with a time constant $RC_2$ to a zero-valued constant portion $a_4$ extending from time $t_8$ onward. A waveform portion preceding sine wave $g_a$ includes another zero-valued constant function $a_1$ extending from an initial instant $t_0$ to a time $t_1$ when an exponentially increasing wave segment $b_1$ having a time constant $RC_1$ starts climbing to substantially reach the level $V_x$ at a times $t_2$. Between time $t_2$ and $t_3$ is a $V_x$-valued constant function $a_2$ continuous on one end with exponential curve $b_1$ and on another end with sine wave $g_a$.

A second graph II of FIG. 5 shows a second composite waveform emitted under the control of unit L on output lead 51' of multiplexer MX substantially in phase quadrature with the waveform of graph I emitted on output lead 51. The waveform of graph II begins with a zero-valued constant segment $a_1'$ between instants $t_0$ and $t_1$ followed by an exponentially decreasing voltage $b_1'$ during interval $t_1-t_2$ and a $V_x'$-valued constant voltage $a_2'$ between times $t_2$ and $t_3$. A first sinusoidal oscillation $g_a'$ lagging sine wave $g_a$ by 90° is continuous at time $t_3$ with constant voltage $a_2'$ and at time $t_5$ with a second sinusoidal oscillation $g_b'$ which lags sine wave $g_b$ by 90° and is followed between times $t_6$ and $t_7$ by a single-valued voltage segment $a_3'$ in turn succeeded between times $t_7$ and $t_8$ by an exponentially decreasing waveform portion $b_2'$ and from time $t_8$ by another zero-valued function $a_4'$. The exponential voltages $b_1'$ and $b_2'$ vary according to respective time constants $RC_3$ and $RC_4$ predetermined by the parameters of RC subcircuit $R_{22}'$, $R_{23}'$, $C_5'$ (FIG. 4).

The quadrature waveforms of FIG. 5 may be used to control the rotation, by means of synchronous motors and a step-down transmission, of a radar antenna having a definite fixed orientation during interval $t_2-t_3$, which has a length sufficient for the emission of microwave radiation. In response to the quadrature waveforms from multiplexer MX (FIG. 1), the antenna scans during interval $t_3-t_5$ a portion of the sky and/or earth surface at a first rate of rotation and then during interval $t_5-t_6$ another portion of the sky and/or earth surface at a faster second rate of rotation. Between times $T_6$ and $t_7$ the antenna has another fixed orientation determined by the radar operator.

To produce the composite waveforms of FIG. 5 the synthesizer illustrated in FIG. 1 is first preset by properly manipulating console switches SO, SS, PS, PW, and PC and by adjusting the potentiometers $P_3$, $P_4$, $P_4'$ of voltage source PO (FIG. 6). Encoders $EN_1$, $EN_2$ are used to write in memory MM (see FIG. 7) the location codes of oscillators $G_a$ and $G_b$, respectively, which generate quadrature sine waves $W_a$, $W_a'$ and $W_b$, $W_b'$ with frequencies equal to sine-wave segments $g_a$, $g_a'$ and $g_b$, $g_b'$, the beginning phases and associated voltage levels of sine waves $g_a$, $g_a'$ being determined by the adjustment of the d-c output voltages of source PO. Particular wave shapes are selected from among five output waveforms of each oscillator $G_a$, $G_b$ by manipulating the rotary switches PW connected to encoders $EC_1$, $EC_2$; units $EC_1$, $EC_2$ write in memory MM two sets of digital pulses coding the selection of quadrature sine waves $W_a$, $W_a'$ and $W_b$, $W_b'$ from among sawtooth volages, triangular waveforms, quadrature sine waves, single sine waves, and square waves (see FIGS. 2 and 8). The numbers of periods $K_a$ and $K_b$ of waveforms $W_a$, $W_a'$ and $W_b$, $W_b'$ to be emitted on the output leads of multiplexer MX (FIGS. 1 and 8) are loaded into memory MM by encoders $ED_1$ and $ED_2$, respectively, upon manipulation of rotary switches PS. Switch SS is closed, for automatic stop, delivering to associated inputs of AND gates $N_{12}$ and $N_{13}$ (FIG. 7) signals of logic levels "1" and "0", respectively (since gate $N_{13}$ has a negated input fed by switch SS); switch PC is closed, determining the transitions from sine wave $g_a$ to sine wave $g_b$ and from sinusoidal voltage $g_a'$ to sinusoidal voltage $g_b'$without intervening constant voltages, applying to AND gates $N_9$, $N_{14}$, $N_{15}$ (FIG. 7) signals of logic levels "0", "1", "0", respectively (the inputs of gates $N_9$ and $N_{15}$ fed by switch PC being negated). A further command is applied by means of pushbutton switch M (FIGS. 1 and 8) to multiplexer MX for switching output leads 51, 51' to the voltage levels present on leads 10, 10', these levels being initially zero.

Unit L commences operations upon the temporary closure of switch SR at time $t_0$; this command resets counters $CC_1$, $CC_2$, $CC_3$ and flip-flop $FF_3$ of timer TM, producing on leads 78, 79, 80 signals of logic level "0", and also resets flip-flops $FF_2$, $FF_4$, $FF_6$ and address unit AU, producing at the output of flip-flop $FF_4$ and at the outputs of flip-flops $FF_2$, $FF_6$ on leads 77, 89 signals of logic level "0". The signal on lead 89 ensures a zero-level signal on lead 125, which in turn causes switch RS to connect amplifier $A_6$ to multiplexer $MX_3$ (FIG. 3) rather than to multiplexer $MX_4$. The signals on leads 77,78, 79 determine collectively the signals on leads 91, 92, 93; between time $t_0$ and time $t_1$ the signals transmitted on leads 91, 92, 93 to switching unit DO keep gates $S_1$, $S_2$, $S_3$ (FIG. 4) closed and lines 10, 10' at a zero voltage level. Command SR also resets via OR gate $O_4$ the buffer register $BR_2$ and reads, via enabling gate $O_5$, the contents of register $BR_2$ onto lead 72, the outputs of decoder $DD_3$ becoming zero except for the output of lead 8', thereby ensuring the switching in multiplexer MX of output leads 51 and 51' to lines 10 and 10', respectively (command SR repeats, as a check, the function of command M).

Figure 10:
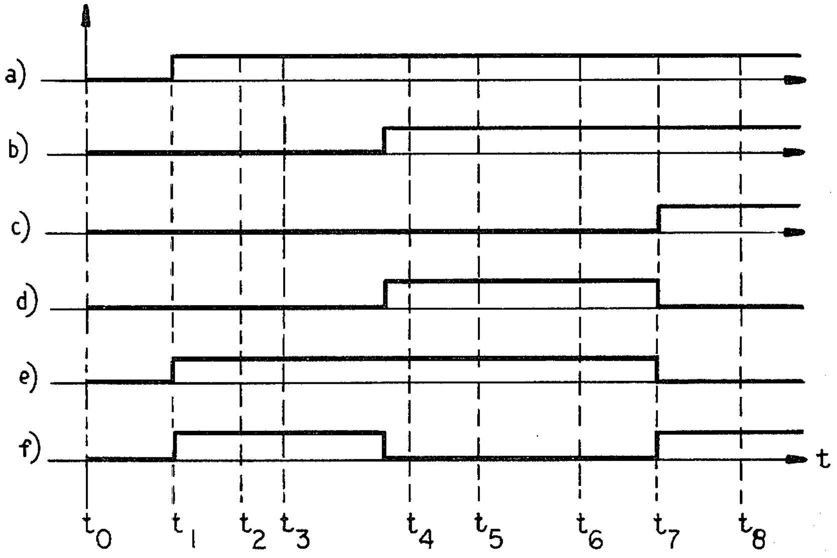
FIG. 10 is a set of graphs showing signal levels on leads within the control unit of FIGS. 1 and 7 and on leads extending between the control unit and the transit network of FIG. 1.

After counting a predetermined number of clock pulses, counter $CC_1$ generates at time $t_1$ a signal level "1" on lead 78, as indicated in a graph a of FIG. 10. This signal is fed back to the negated input of AND gate $N_6$, blocking further clock pulses from stepping the counter; the output of counter $CC_1$ remains at the high logic level until switch SR is closed again. With the change in signal level on lead 78, the outputs of AND gate $N_4$ and NAND gate $N_5$ change to logic level "1", thereby opening gates $S_2$ and $S_3$ and generating on leads 10, 10' (and outputs 51, 51') the exponential voltages $b_1$, $b_1'$ which increase and decrease, respectively, during the interval $t_1-t_2$ to the levels of voltages $V_x$ and $V_x'$ present on leads 61, 61' (FIGS. 1 and 4).

At a predetermined instant between times $t_2$ and $t_3$, counter $CC_2$ emits on lead 80 a pulse which sets flip-flop $FF_3$ blocking via AND gate $N_7$ further stepping pulses from generator PG, and which advances address unit AU to read onto leads 70, 73, 74 from memory MM the command instructions loaded thereinto by encoders $EN_1$, $EC_1$, $ED_1$, respectively. The instruction coding the location of oscillator $G_a$ is fed via lead 70 into buffer registers $BR_1$, $BR_2$ and to decoder $DD_1$ whose subsequent output on leads $\mathbf{51}_a$, $\mathbf{51}_b$... $\mathbf{51}_n$ induces the transmission of ramp voltage $P_a$ from lead $\mathbf{3}_a$ to lead 303 (FIG. 3) for comparison by amplifiers $A_7$, $A_8$ with the d-c potential $V_r$ decreased slightly in value by potentiometer $P_2$ and delivered to switch RS by multiplexer $MX_3$, as determined by the signals on leads $\mathbf{51}_a$, $\mathbf{51}_b$... $\mathbf{51}_n$. The command instruction coding quadrature sine waves (instead of sawtooth, triangular single sinusoidal, or square wave) is loaded via lead 73 into buffer register $BR_2$ for subsequent feeding to decoder $DD_3$ along with the location of oscillator $G_a$. A binary pulse train coding the number of cycles $K_a$ is loaded into register $BR_4$ from lead 74 for comparison in multistage binary comparator $B_1$ with the outputs of the stages of cycle counter CT, this counter receiving on lead 4 a stepping pulse train generated by differentiating amplifier $A_9$ (FIG. 9) from synchronizing signal $S_a$ selected by multiplexer $MX_5$ from among the input voltages on lines $\mathbf{2}_a$, $\mathbf{2}_b$... $\mathbf{2}_n$ in accordance with the signals transmitted from decoder $DD_1$ on multiple 155.

Upon detecting an equivalence of the signals received on lines 6 and $\mathbf{3}_a$, analog comparator CP forwards to control unit L on lead 7 a pulse enabling the reading of the contents of buffer register $BR_2$ to decoder $DD_3$ which consequently induces multiplexers $MX_1$, $MX_2$ (FIG. 8) to switch at time $t_4$ outputs 51, 51' from the aperiodic signals present on leads 10, 10' to the quadrature sine waves $W_a$, $W_a'$ present on multiple $l_a$. The enabling pulse emitted by comparator CP also sets flip-flop $FF_5$ via AND gate $N_{12}$ (command from switch SS having logic level "1"), the output signal of the flip-flop in turn enabling counter CT to be stepped by the pulses on lead 4. Upon the counting of $K_a$ cycles by counter CT, comparator $B_1$ emits a signal setting flip-flops $FF_1$ and $FF_2$, the resultant change in the voltage level of lead 77 causing by means of circuit LL changes in the logic levels of the signals on lead 91 and 93; at a time immediately prior to instant $t_4$, as indicated in a graph d of FIG. 10, lead 91 changes its signal from a logic level "0" to a logic level "1", while the level on lead 93 changes from "1" to "0", as indicated in graph f of FIG. 10. Thus with the change in voltage of lead 77, as indicated by a graph b of FIG. 10, gates $S_1$ and $S_3$ become open and closed, respectively, and gate $S_2$ remains open (since the logic level of the signal on lead 92 remains "1", as indicated in a graph e of FIG. 10).

The "set" output of flip-flop $FF_1$ enables AND gate $N_{11}$ to emit a pulse on lead 88 upon receiving a pulse on lead 7 from analog comparator CP. The pulse emitted by AND gate $N_{11}$ simultaneously resets flip-flops $FF_1$, $FF_5$ and counter CT, sets flip-flop $FF_6$, reads the contents of buffer register $BR_1$ onto lead 71 for series/parallel conversion by decoder $DD_2$ and advances address unit AU to read onto leads 70, 73, 74 from memory MM the command instructions loaded thereinto by encoders $EN_2$, $EC_2$ $ED_2$, respectively. A signal of logic level "1" on lead 89 produced by flip-flop $FF_6$ in response to the pulse from AND gate $N_{11}$ enables AND gate $N_{14}$ to change its output voltage on lead 125 from zero to a positive value, inducing switch RS (FIG. 3) to connect amplifier $A_6$ to multiplexer $MX_4$ whose output lead 333 carries ramp voltage $P_a$, as determined by the signals received by multiplexer $MX_4$ from decoder $DD_2$ on leads $52_a$, $52_b$ . . . $52_n$ (see FIG. 7). Substantially at the same time that lead 333 is connected to lead $3_a$, multiplexer $MX_4$ switches onto lead 303, in response to signals received from decoder $DD_1$ (FIG. 7) on leads $51_a$, $51_b$ . . . $51_n$, the ramp voltage $P_b$ present on lead $3_b$. The signals on leads $51_a$, $51_b$ . . . $51_n$ also induce multiplexer $MX_5$ (FIG. 9) to switch onto output lead 36 the square wave $S_b$ for conversion by differentiator $A_9$ into a stepping pulse train fed to counter CT on lead 4. Register $BR_1$ now contains the location code of oscillator $G_b$, while register $BR_2$ contains the command instructions specifying the quadrature sine waves $W_b$, $W_b'$ of oscillator $G_b$; register $BR_4$ holds binary instructions coding the number of cycles $K_b$.

Upon detecting a coincidence of the ramp voltages $P_a$, $P_b$, analog comparator CP forwards to control unit L a pulse enabling the stepping of counter CT by the pulse train present on lead 4 and the reading of the contents of register $BR_2$ to decoder $DD_3$ whose consequent output signals on multiple 8 switch in multiplexers $MX_1$, $MX_2$ the signals on leads 51, 51' from quadrature sine waves $W_a$, $W_a'$ to the quadrature sine waves $W_b$, $W_b'$. Upon the counting of $K_b$ cycles by unit CT, multistage comparator $B_1$ once again transmits a logic pulse to flip-flop $FF_1$ through OR gate $O_1$, setting the flip-flop, thereby enabling AND gate $N_{11}$ to generate on lead 88 a logic pulse upon receiving an enabling pulse from comparator CP on lead 7. The pulse produced on lead 88 resets flip-flops $FF_1$, $FF_5$ and cycle counter CT, reads the contents of register $BR_1$ into register $BR_3$, and advances address unit AU to read onto leads 70, 73, 74 from memory MM zero-level signals indicating that the last command instructions have just been executed,- these zero-level instructions being loaded into buffer registers $BR_1$, $BR_2$ and fed on lead 70 to multistage binary comparator $B_5$ which emits on lead 85 a signal of logic level "1" upon detecting on lead 70 a zero-level signal. Comparator $B_5$ is enabled by a pulse generated on lead 86 by address unit AU concurrently with a reading signal fed to memory MM, whereby comparator $B_5$ monitors in relation to ground each oscillator location code read from memory MM on lead 70.

The signal of logic level "1" produced on lead 85 by comparator $B_5$ and fed to the negated input of AND gate $N_{14}$ changes the voltage level on lead 125 from positive to zero (i.e. from logic level "1" to logic level "0"), thereby operating on switch RS to connect amplifier $A_6$ (FIG. 3) to multiplexer $MX_3$. The signal of logic level of "1" on lead 85 also reads the contents of register $BR_3$, i.e the location code of oscillator $G_b$, onto lead 87 and thus to decoder $DD_1$ whose output signals on leads $51_a$, $51_b$ . . . $51_n$ ensure the continued connection in analog comparator CP of lead $3_b$ to lead 303. Upon detecting a coincidence of the ramp signal $P_b$ on lead $3_b$ and a d-c potential on lead 6 (this potential having been changed by an operator prior to time $t_6$ from the level existing at time $t_3$), comparator CP forwards on lead 7 to control unit L a pulse enabling the reading of the contents of register $BR_2$ to decoder $DD_3$, whic generates on its output lead 8' at time $t_6$ a signal switching output leads 51, 51' of multiplexer MX to leads 10, 10'. The pulse from comparator CP also sets, via AND gate $N_{10}$, flip-flop $FF_4$ whose output signal of logic level "1" enables, via OR gate $O_2$ and AND gate $N_8$, the stepping of counter $CC_3$ by clock pulses from generator PG. After a time interval $t_6-t_7$, long enough for the performance of desired measurements by an operator, counter $CC_3$ generates on lead 79 a signal of logic level "1", as indicated in a graph c of FIG. 10, thereby changing the voltage levels on lead 91, 92, 93, as indicated in graphs d, e, f of FIG. 10, respectively. Consequently, gates $S_1$, $S_2$ become closed and gate $S_3$ opens producing on leads 51, 51' the decaying exponentials $b_1$, $b_1'$ which after an interval $t_7-t_8$ determined by time constants $RC_2$ and $RC_4$ are reduced to zero.

It will be noted that the initial and the final phases of the composite waveforms I and II, that is, the initial phases of sine waves $g_a$, $g_a'$ and the final phase of sine waves $g_b$, $g_b'$, have been completely determined in accordance with the d-c potential $V_r$ produced by source PO under the control of the operator. It will also be noted that waveform portions $g_a$, $g_b$ and $g_a'$, $g_b'$ have been conveyed to output leads 51, 51' without undergoing any possibly distorting operations such as those for cycle counting or phase locking.

We shall now describe particular operations of a generator according to our invention with reference to other possible combinations of commands SS and PC. If command PC is selected for interleaving with constant d-c voltages the waveforms selected according to commands SO and PW (PC=0), the buffer register $BR_2$ is reset and enabled by a signal emitted from AND gate $N_{15}$ through OR gates $O_4$ and $O_5$ in response to a signal generated on lead 88 by AND gate $N_{11}$. Gate $N_{11}$ is enabled by the "set" output of flip-flop $FF_1$ to produce a pulse of lead 88 upon receiving a pulse from comparator CP on lead 7, flip-flop $FF_1$ in turn being set by a signal from comparator $B_1$ in the case of automatic stop (SS=1) or from AND gate $N_{13}$ in the case of manual stop (SS=0). The pulse setting flip-flop $FF_1$ in the case of manual stop is fed to AND gate $N_{13}$ according to pushbutton command ST.

In the case of command PC being set at logic level "0" (the switches shown in FIGS. 1 and 7 for command PC being open), the resetting of register $BR_2$ by the signal from AND gate $N_{15}$ and, substantially simultaneous therewith, the reading of the reset contents of this register to decoder $DD_3$ effect the connecting in multiplexer MX of outputs 51, 51' to lines 10, 10', terminating the conduction of any oscillator waveform component to outputs 51, 51'. Thus, a sequence of waveforms $W_1$, $W_2 \ldots W_m$ from oscillators $G_1, G_2 \ldots G_m$, selected according to commands SO and PW, will be interleaved at the output of multiplexer MX with d-c voltages delivered to transit network DO from voltage source PO according to the setting of potentiometers $P_3$, $P_4$, $P_4'$ by an operator. Substantially simultaneous with the termination of waveform $W_m$, a signal of logic level "1" generated by comparator $B_5$ upon a reading of memory MM by address unit AU is fed via AND gate $N_9$ (enabled at its negated input by command PC) and OR gate $O_2$ to AND gate $N_8$, thereby enabling the stepping of counter $CC_3$ by clock pulses from generator PG. After counting a predetermined number of pulses, unit $CC_3$ emits on lead 79 a signal of logic level "1" fed back to the negated input of AND gate $N_8$, blocking further stepping pulses from reaching counter $CC_3$. As heretofore described with reference to the synthesis of the composite waveforms of FIG. 5, the change in signal level of lead 79 induces via logic subcircuit LL the closing of gates $S_1$ and $S_2$ and the opening of gate $S_3$ in transit network DO, producing on leads 10, 10' a pair of signals varying exponentially according to RC time constants determined by the elements of the transit network.

Upon the completion of synthesis of any composite waveform by the signal generator according to our invention, control unit L may be reset by clearing memory MM with a command PS'(FIG. 7); by loading the memory with oscillator-location instructions coded by units $EN_1, EN_2 \ldots EN_m$ in accordance with command SO, with waveform-shape specifications coded by units $EC_1, EC_2 \ldots EC_m$ in accordance with command PW, and with numbers of cycles for successive waveform components coded by units $ED_1, ED_2 \ldots ED_m$ in accordance with command PS; and by actuating pushbutton command SR, resetting counters $CC_1$, $CC_2$, $CC_3$, flip-flops $FF_2$, $FF_3$, $FF_4$, $FF_6$ and address unit AU and ensuring via buffer register $BR_2$ and decoder $DD_3$ the connection in multiplexer MX of lead 51 to lead 10'.

It will be observed that potentiometers $P_{2a}$–$P_{2n}$ shown in FIG. 3, ganged for simultaneously adjusting the level of potential $V_r$ by amounts proportional to the frequencies of oscillators $G_a$–$G_n$, may be reduced in number if at least two oscillators $G_a$–$G_n$ generate output waveforms of equal frequency. If at least some of the oscillators emit periodic waveforms of different frequencies, potentiometric unit $P_2$ will include a plurality of potentiometers respectively assigned to the different frequencies.

We claim:

1. A controlled generator of an alternating waveform, comprising:

oscillator means for producing a periodic waveform together with a phase-indicating signal in the form of a substantially sawtooth-shaped voltage having the same period as said periodic waveform;

a multiplexer having at least one output, said multiplexer being operationally connected to said oscillator means for selectively switching said waveform onto said output;

a voltage source for supplying a predetermined potential;

comparator means operationally linked to said oscillator means and to said source for generating an enabling pulse upon detecting an equivalence of said potential and said sawtooth-shaped voltage; and a logic circuit operationally coupled with said comparator means and with said multiplexer for controlling same in response to said enabling pulse, producing on said output an oscillating voltage having a predetermined initial phase and a predetermined final phase.

2. A generator as defined in claim 1, further comprising a switching circuit connected to said logic circuit and to said source for generating a buffer signal having a form determined by said logic circuit, said multiplexer being operationally linked to said switching circuit for receiving said buffer signal therefrom for intermittent transmission onto said output under the control of said logic circuit, whereby said oscillating voltage is provided with a preceding waveform portion and a succeeding waveform portion continuous with said oscillating voltage at either end, respectively.

3. A generator as defined in claim 2 wherein said switching circuit includes an RC subcircuit and a plurality of analog switches for generating an exponential signal transmitted to said multiplexer as part of said buffer signal.

4. A generator as defined in claim 2 or 3 wherein said source includes a first manually adjustable potentiometer for controllably changing the level of said potential, thereby selecting values of said initial phase and said final phase, and a second potentiometer having a variation characteristic similar to a cyclic variation of said periodic waveform, said second potentiometer being operationally linked to said first potentiometer for varying in accordance with selected values of said initial phase and said final phase the level of a DC voltage fed to said switching circuit.

5. A generator as defined in claim 1 wherein said comparator means includes a first comparator and a second comparator interconnected at a noninverting input and an inverting input, respectively, for receiving the same sawtooth-shaped voltage from said oscillator means, said first comparator having an inverting input receiving said potential via a diode and said second comparator having a noninverting input receiving said potential, said comparators having a common output lead connected to said logic circuit for transmitting an enabling pulse thereto upon coincidence of said potential and such sawtooth-shaped voltage.

6. A generator as defined in claim 1 wherein said logic circuit includes a counter for disabling transmission of a periodic waveform onto said output only upon counting a predetermined number of transmitted cycles of such periodic waveform, further comprising a conversion circuit operationally linked to said oscillator means for receiving therefrom a synchronizing signal having the same period as such periodic waveform and to said logic circuit for stepping said counter in response to said synchronizing signal.

7. A generator as defined in claim 1, 2, 5 or 6 wherein said oscillator means includes a plurality of oscillators operationally connected to said multiplexer for delivering thereto respective periodic waveforms to be selectively switched onto said output under the control of said logic circuit, said oscillators being operationally linked to said comparator means for feeding thereto substantially sawtooth-shaped voltages respectively indicating the phases of said periodic waveforms, said logic circuit including a memory for storing instructions in part specifying a plurality of said periodic waveforms to be transmitted by said multiplexer onto said output for forming said oscillating voltage, said comparator means including an additional multiplexer operationally coupled with said logic circuit for selecting sawtooth-shaped voltages in accordance with said instructions, whereby said comparator means generates a train of pulses enabling said logic circuit.

8. A generator defined in claim 7 wherein at least some of the periodic waveforms emitted by said oscillators have different frequencies, said sawtooth-shaped voltages having the same frequencies as the respective periodic waveforms, further comprising a plurality of potentiometers respectively assigned to said different frequencies and ganged for simultaneous adjustment upon manipulation, said potentiometers being connected to said source for adjusting the level of said potential by amounts proportional to said different frequencies to compensate processing delays in said logic circuit; said comparator means including switchover means connected to said potentiometers and to said logic circuit for selecting, under the control thereof and for comparison with a sawtooth-shaped voltage selected by said additional multiplexer, an output voltage of a potentiometer assigned to the frequency of the selected sawtooth-shaped voltage.

9. A generator as defined in claim 1, 2, 5 or 6 wherein said oscillator means includes a field-effect transistor connected in a biasing network for producing from a triangular wave a sinusoidal oscillation having a periodic waveform.

10. A generator as defined in claim 1, 2, 5 or 6, further comprising a potentiometer connected to said source and said comparator means for adjusting the level of said potential.

* * * * *